(12) United States Patent
Kalnitsky et al.

(10) Patent No.: US 6,218,688 B1
(45) Date of Patent: Apr. 17, 2001

(54) SCHOTTKY DIODE WITH REDUCED SIZE

(75) Inventors: Alexander Kalnitsky, San Francisco; Pavel Poplevine, Foster City; Albert Bergemont, Palo Alto, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/280,888

(22) Filed: Mar. 29, 1999

(51) Int. Cl.[7] ................................................. H01L 27/095
(52) U.S. Cl. ......................... 257/280; 257/282; 257/284; 257/751; 257/754; 257/757; 257/476; 438/571; 438/576; 438/581; 438/582
(58) Field of Search ..................................... 257/280, 281, 257/282, 283, 284, 751, 754, 755, 757, 763, 476, 486; 438/576, 582, 581, 571

(56) References Cited

U.S. PATENT DOCUMENTS 5,021,840 * 6/1991 Morris ..................................... 357/15
5,589,697 * 12/1996 Smayling et al. .................... 257/204
5,614,755 * 3/1997 Hutter et al. ........................... 257/41
5,665,993 9/1997 Keller et al. .......................... 257/377

FOREIGN PATENT DOCUMENTS 56-30748 * 3/1981 (JP) .
61-85862 * 5/1986 (JP) .

OTHER PUBLICATIONS

Sze S. M., "Physics of Semiconductor Devices," Second Edition, Wiley, 1981, pp. 270–293.

* cited by examiner

Primary Examiner—William Mintel
(74) Attorney, Agent, or Firm—Pillsbury Winthrop LLP

(57) ABSTRACT

The silicon real estate consumed by a conventional Schottky diode is reduced in the present invention by forming the Schottky diode through a field oxide isolation region. Etching through the field oxide isolation region requires extra etch time which is provided by conventional etch steps that typically specify a 50–100% overetch during contact formation.

13 Claims, 10 Drawing Sheets

SCHOTTKY DIODE WITH REDUCED SIZE

BACKGROUND OF THE INVENTION

1. Field of the Invention

The present invention relates to a method for forming semiconductor devices and, more particularly, to a method for forming Schottky diodes in a CMOS process.

2. Description of the Related Art

A Schottky diode is a metal-to-semiconductor structure which is physically similar to a metal contact; essentially differing only in that the Schottky diode is formed on a lightly-doped region of the substrate, while the metal contact is formed on a heavily-doped region of the substrate.

Although physically similar, the Schottky diode and the metal contact exhibit very different current-to-voltage (I/V) relationships. This difference is due to the different dopant concentrations that are used in the two substrate regions.

The Schottky diode, which is formed on the lightly-doped region, has a current-to-voltage (I/V) relationship that is similar to the I/V relationship of a pn diode. That is, when forward biased, a Schottky diode provides a low-resistance current path and, when reverse-biased, a high-resistance current path. On the other hand, the metal contact, which is formed on the heavily-doped region, has a I/V relationship that is linear or resistive.

FIG. 1 shows a cross-sectional diagram that illustrates a wafer 100 which has a conventionally formed Schottky diode and a conventionally formed metal contact. As shown in FIG. 1, wafer 100 includes an n-type semiconductor material 110, such as a substrate or a well, and a plurality of field oxide isolation regions FOX which are formed in material 110.

Wafer 100 also includes an n+ region 112 and a p+ region 114 which are both formed in material 110, and an n– region 116 which is defined in material 110. N+ region 112 represents the heavily-doped substrate region of a biasing contact, while p+ region 114 represents the heavily-doped source and drain regions of a CMOS transistor. N– region 116, in turn, represents the lightly-doped substrate region of a Schokkty diode.

As further shown in FIG. 1, wafer 100 also includes a layer of planarized silicon dioxide 120 which is formed over material 110 and the field oxide isolation regions FOX. Layer 120, in turn, has an opening 122 which exposes n+ region 112, an opening 124 which exposes p+ region 114, and an opening 126 which exposes n– region 116.

Wafer 100 additionally includes a layer of titanium 128 which is formed over regions 112, 114, and 116, and the sidewalls of the openings 122, 124, and 126, and a layer of titanium nitride 130 which is formed over titanium layer 128. Titanium layer 128 and titanium nitride layer 130 form a diffusion barrier to prevent junction spiking. (Part of titanium layer 130 is converted into titanium silicide during the heat treatments that are associated with contact formation.)

Further, wafer 100 includes an aluminum or tungsten plug 132 which is formed over titanium nitride layer 130 in opening 122, an aluminum or tungsten plug 134 which is formed over titanium nitride layer 130 in opening 124, and an aluminum or tungsten plug 136 which is formed over titanium nitride layer 130 in opening 126. In addition, a plurality of aluminum lines 138, 140, and 142 are connected to plugs 132, 134, and 136, respectively, and other lines to realize the underlying electrical circuit.

As shown in FIG. 1, a substrate biasing contact 144 is formed by n+ region 112, barrier layers 128 and 130, and plug 132, while a source/drain contact 146 is formed by p+ region 114, barrier layers 128 and 130, and plug 134. Further, a Schottky diode 148 is formed by an n-region 116, barrier layers 128 and 130 (titanium/titanium silicide and titanium nitride), and plug 136.

One of the problems with Schottky diode 148, however, is that the minimum size of diode 148 is typically determined by the minimum contact size that is available in the photolithographic process. As a result, diode 148 consumes a significant amount of silicon real estate (substrate surface area). Thus, there is a need for a Schottky diode that requires less silicon real estate.

SUMMARY OF THE INVENTION

Conventionally, Schottky diodes require a significant amount of silicon real estate as the minimum size of the diode is typically limited to the minimum contact size that is available. The present invention eliminates the silicon real estate required by the diode by forming the Schottky diode through a field oxide isolation region.

In accordance with the present invention, a wafer, which has a Schottky diode, includes a semiconductor material which has a first conductivity type and a first dopant concentration, and a first region which is formed in the semiconductor material. The first region has a second conductivity type and a second dopant concentration.

The wafer also includes a field oxide isolation region which is formed in the semiconductor material, the field oxide isolation region has a first opening that extends through the field oxide isolation region.

The wafer further includes a second region which is defined in the semiconductor material to adjoin the first opening in the field oxide isolation region, and a layer of insulation material which is formed over the first region and the field oxide isolation region. The second region has the first conductivity type and the first dopant concentration.

The layer of insulation material has a second opening that extends through the layer of insulation material, and a third opening that extends through the layer of insulation material. The second opening adjoins the first region while the third opening adjoins the first opening.

The wafer additionally includes a layer of barrier material which is formed on the sidewalls of the second opening, the first region, the sidewalls of the first and third openings, and the second region. Further, a first metal plug is formed in the second opening to contact the layer of barrier material, while a second metal plug is formed in the first and third openings to contact the layer of barrier material.

The present invention also includes a method for forming a Schottky diode in a wafer. The wafer has a semiconductor material which has a first conductivity type and a first dopant concentration, and a first region that is formed in the semiconductor material. The first region has a second conductivity type and a second dopant concentration.

The wafer also has a field oxide region that is formed in the semiconductor material, a second region which is defined in the semiconductor material below the field oxide region, and a layer of insulation material which is formed over the first region and the field oxide region.

The method of the present invention comprises the steps of selectively removing the layer of insulation material to form a first opening that exposes the first region to form an exposed first region, and a second opening that exposes the second region to form an exposed second region.

The method also includes the steps of forming a layer of barrier material on the layer of insulation material, the exposed first region, and the exposed second region, and forming a layer of metal over the layer of barrier material.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
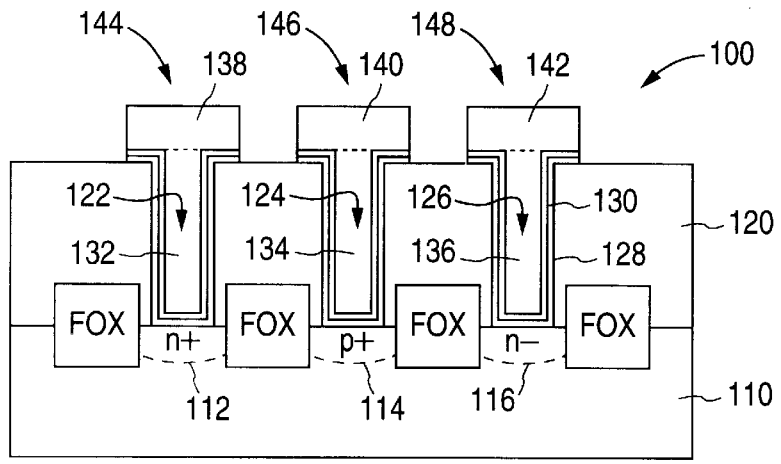
FIG. 1 is a cross-sectional diagram illustrating a prior art wafer 100 which has a conventionally formed Schottky diode and a conventionally formed metal contact.
Figure 2:
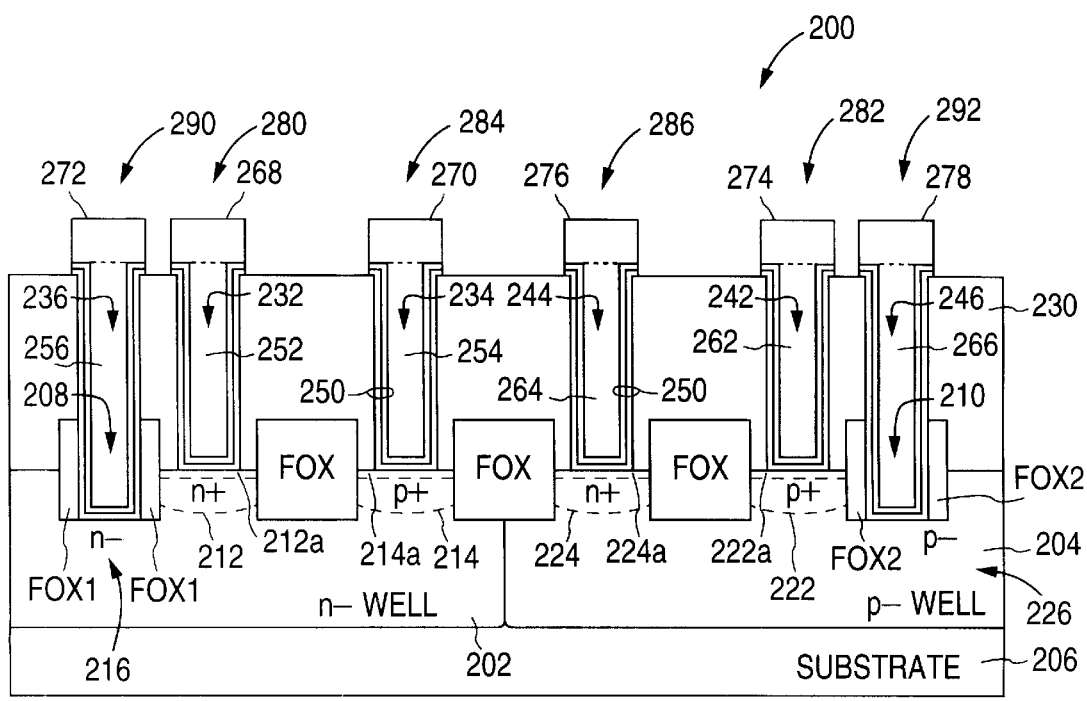
FIG. 2 is a cross-sectional drawing illustrating a wafer 200 which has a Schottky diode in accordance with the present invention.

FIG. 2 shows a cross-sectional drawing that illustrates a wafer 200 which has a Schottky diode in accordance with the present invention. As described in greater detail below, the present invention reduces the silicon real estate that is consumed by a Schottky diode by forming the diode through an isolation region.

As shown in FIG. 2, wafer 200 includes an n-well 202 and a p-well 204 which are both formed in a substrate 206, and a plurality of field oxide isolation regions FOX that include a field oxide isolation region FOX1 which is formed in well 202, and a field oxide isolation region FOX2 which is formed in well 204.

In accordance with the present invention, field oxide isolation region FOX1 includes an opening 208 which extends through isolation region FOX1, while field oxide isolation region FOX2 includes an opening 210 which extends through isolation region FOX2.

Wafer 200 also includes an n+ region 212 and a p+ region 214 which are both formed in n-well 202. Regions 212 and 214, in turn, may optionally include overlying salicide layers 212a and 214a which are conventionally formed from titanium silicide ($TiSi_2$) or the Group III silicides such as cobalt silicide ($CoSi_2$). N+ region 212 represents the heavily-doped substrate region of a biasing contact, while p+ region 214 represents the heavily-doped source and drain regions of an p-channel transistor.

Wafer 200 further includes an n– region 216 which, in accordance with the present invention, is defined in well 202 below opening 208 in field oxide isolation region FOX1. N– region 216 represents the lightly-doped substrate region of a Schottky diode.

Similarly, wafer 200 includes a p+ region 222 and an n+ region 224 which are both formed in p-well 204. Regions 222 and 224 may optionally include overlying salicide layers 222a and 224a which are conventionally formed from titanium silicide ($TiSi_2$) or the Group III silicides such as cobalt silicide ($CoSi_2$). P+ region 222 represents the heavily-doped substrate region of a biasing contact, while n+ region 224 represents the heavily-doped source and drain regions of an n-channel transistor.

Wafer 200 additionally includes a p– region 226 which, in accordance with the present invention, is defined in well 204 below opening 210 in field oxide isolation region FOX2. P– region 226 represents the lightly-doped substrate region of a Schokkty diode.

As further shown in FIG. 2, wafer 200 also includes a layer of planarized silicon dioxide 230 which is formed over wells 202 and 204 and the field oxide isolation regions FOX, FOX1, and FOX2. Layer 230 has an opening 232 which exposes n+ region 212, and an opening 234 which exposes p+ region 214. In addition, layer 230 also has an opening 236 which is in register with opening 208 in field oxide isolation region FOX1 to thereby expose n– region 216.

Layer 230 further includes an opening 242 which exposes p+ region 222, and an opening 244 which exposes n+ region 224. In addition, layer 230 further has an opening 246 which is in register with opening 210 in field oxide isolation region FOX2 to expose p– region 226.

Further, wafer 200 additionally includes a diffusion barrier 250 which is formed over regions 212, 214, 216, 222, 224, and 226, and on the sidewalls of openings 232, 234, 236, 242, 244, and 246. Diffusion barrier 250 may include, for example, a layer of titanium (Ti) and an overlying layer of titanium nitride (TiN). Diffusion barrier 250 is used to prevent junction spiking.

As additionally shown in FIG. 2, wafer 200 also includes an aluminum or tungsten plug 252 which is formed over barrier 250 in opening 232, an aluminum or tungsten plug 254 which is formed over barrier 250 in opening 234, and an aluminum or tungsten plug 256 which is formed over barrier 250 in opening 236.

An aluminum or tungsten plug 262 is formed over barrier 250 in opening 242, an aluminum or tungsten plug 264 is formed over barrier 250 in opening 244, and an aluminum or tungsten plug 266 is formed over barrier 250 in opening 246. In addition, a plurality of aluminum lines 268, 270, 272, 274, 276, and 278 are connected to plugs 252, 254, 256, 262, 264, and 266, respectively, and other lines to realize the underlying electrical circuit.

As shown in FIG. 2, a substrate biasing contact 280 is formed by n+ region 212, barrier 250, and aluminum plug 252, while a substrate biasing contact 282 is formed by p+ region 222, barrier 250, and aluminum plug 262. In addition, a source/drain contact 284 is formed by p+ region 114, barrier 250, and aluminum plug 254, while a source/drain contact 286 is formed by n+ region 224, barrier 250, and aluminum plug 264.

Further, a Schottky diode 290 is formed by region 216, barrier 250, and aluminum plug 256, while a Schottky diode 292 is formed by p– region 226, barrier 250, and aluminum plug 266.

One of the advantages of the present invention is that since Schottky diodes 290 and 292 are formed through the field oxide regions FOX1 and FOX2, respectively, a separate isolated area of the substrate is no longer required to support the diode. As a result, the Schottky diode of the present invention can be formed without consuming any silicon real estate.

Figure 3:
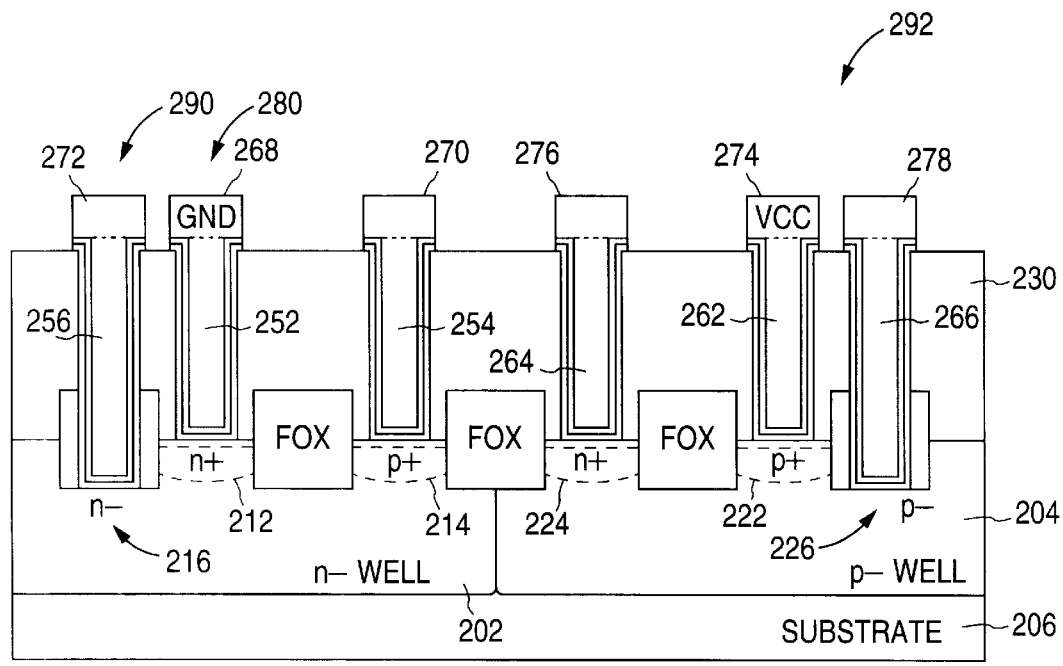
FIG. 3 is a cross-sectional diagram illustrating wafer 200 with applied biasing voltages in accordance with the present invention.

One example of how Schottky diodes 290 and 292 can be used is shown in FIG. 3. FIG. 3 is a cross-sectional diagram that illustrates wafer 200 with applied biasing voltages. When ground is applied to plug 252 via line 268, n-well 202 is biased to ground. As a result, diode 290 prevents line 272 from going more positive than a few tenths of a volt because a positive voltage on line 272 forward biases diode 290.

Similarly, when a positive voltage is applied to plug 262 via line 274, p-well 204 is biased positive. As a result, diode 292 prevents line 278 from going more negative than a few tenths of a volt because a negative voltage on line 278 forward biases diode 292.

Figure 4A:
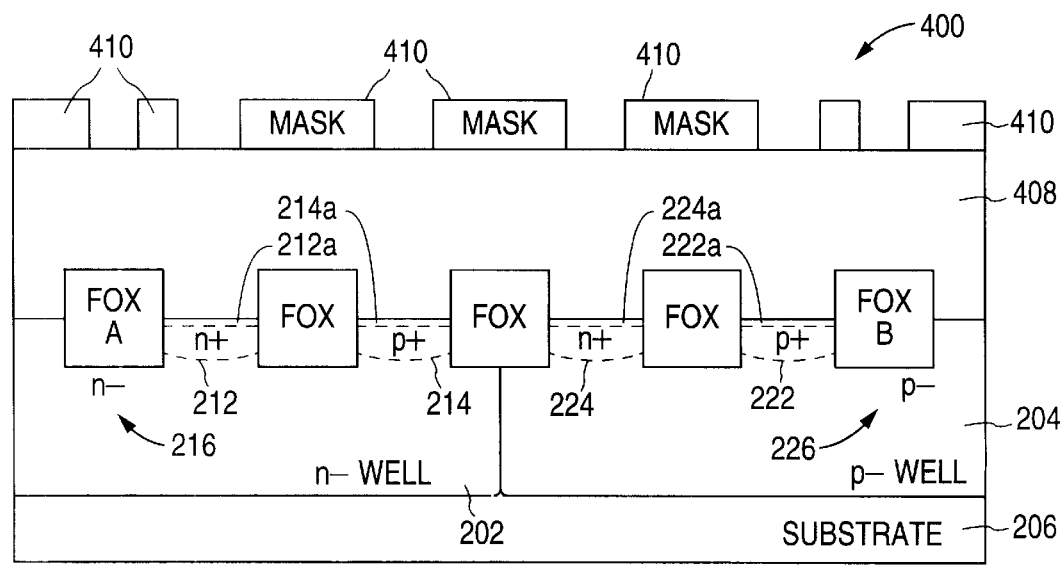
FIGS. 4A–4E are cross-sectional diagrams illustrating a method for forming a Schottky diode in accordance with the present invention.

FIGS. 4A–4E show a series of cross-sectional diagrams that illustrate a method for forming a Schottky diode in accordance with the present invention. As shown in FIG. 4A, the method begins with a wafer 400 which is a partially completed version of wafer 200.

In wafer 400, n-well 202, p-well 204, and substrate 206 are conventionally formed. In addition, a plurality of LOCOS-formed field oxide isolation regions FOX are formed in wells 202 and 204. The field oxide isolation regions FOX include a region FOXA which is formed in well 202, and a region FOXB which is formed in well 204.

Further, regions 212, 214, 222, and 224 are conventionally formed in wells 202 and 204, and may optionally include salicide layers 212a, 214a, 222a, and 224a, respectively. Wafer 400 also includes a conventionally formed and planarized layer of insulation material 408, such as silicon dioxide, which is formed over wells 202 and 204, and field oxide isolation regions FOX, FOXA, and FOXB.

As shown in FIG. 4A, the process begins by defining regions 216 and 226 under isolation regions FOXA and FOXB, and then forming a mask 410 on silicon dioxide layer 408. Mask 410 is then patterned to have unmasked areas over regions 212, 214, 216, 222, 224, and 226.

Figure 4B:
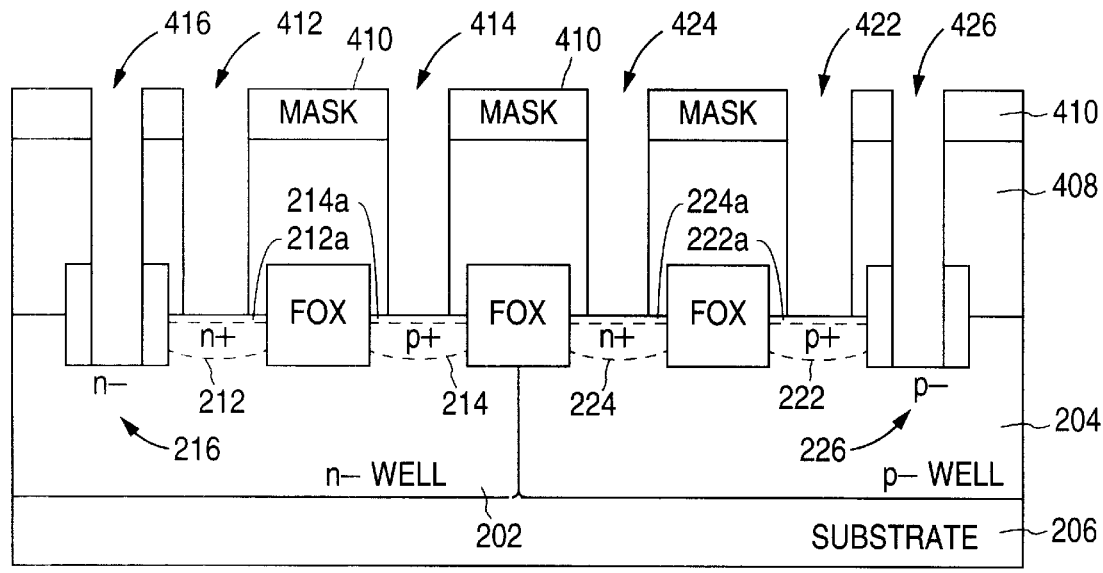

After this, as shown in FIG. 4B, the unmasked areas of silicon dioxide layer 408 are etched to form an opening 412 that exposes region 212, an opening 414 that exposes region 214, and an opening 416 that exposes region 216. In addition, the etch also forms an opening 422 that exposes region 222, an opening 424 that exposes region 224, and an opening 426 that exposes region 226.

Figure 4C:
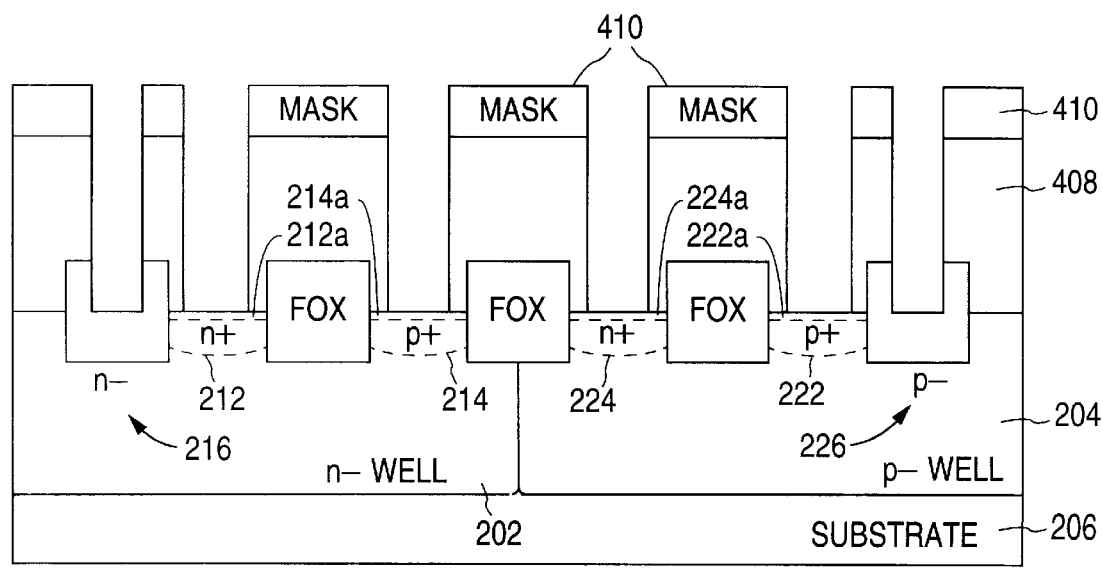

As shown in FIG. 4C, the etch exposes regions 212, 214, 222, and 224 before exposing regions 216 and 226. Thus, regions 212, 214, 222, and 224 must be overetched by an amount which allows the etch to expose regions 216 and 226.

When regions 212, 214, 222, and 224 include salicide layers 212a, 214a, 222a, and 224a, this overetching presents little concern since the silicon dioxide of isolation regions FOXA and FOXB is etched at a much faster rate than salicide layers 212a, 214a, 222a, and 224a.

Even when salicide layers 212a, 214a, 222a, and 224a are not present, this overetching causes little damage since the silicon dioxide in isolation regions FOXA and FOXB is etched with an etchant that has a selectivity of 10:1 or greater with respect to silicon.

Further, it is a common practice to overetch contact openings by 50–100% to insure that layer 408 is completely removed. This overetching, in turn, provides more than the needed time for the etching to etch all of the way through the field oxide isolation regions FOXA and FOXB and remove the oxide from the surface of regions 216 and 226.

Figure 5A:
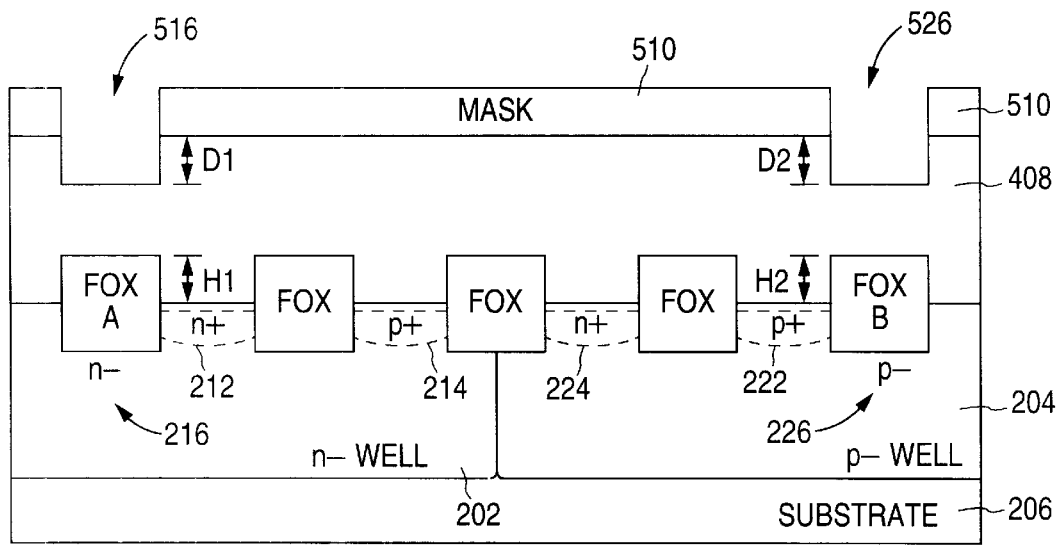
FIGS. 5A and 5B are cross-sectional diagrams illustrating a two-step etch process in accordance with the present invention.
Figure 5B:
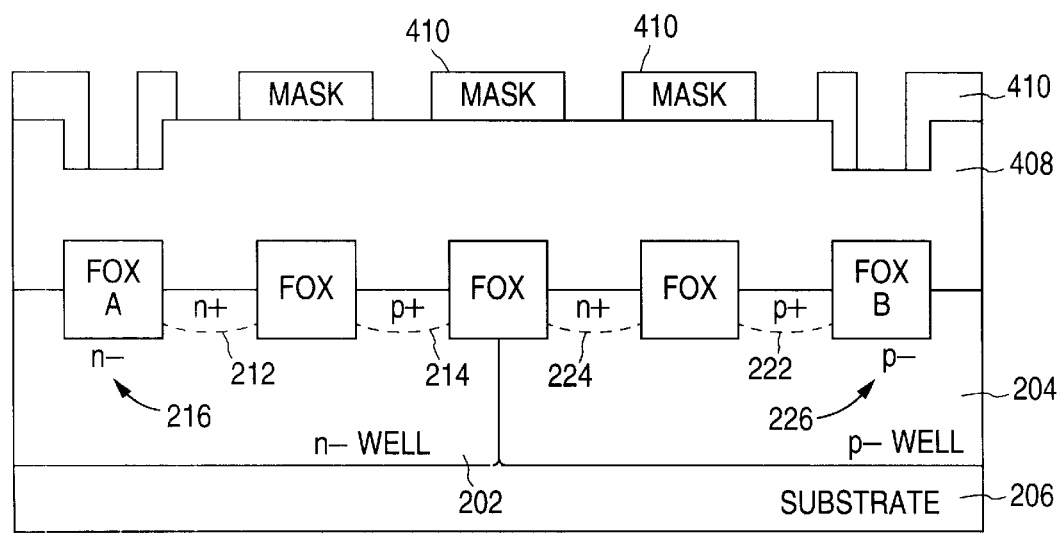
Figure 6A:
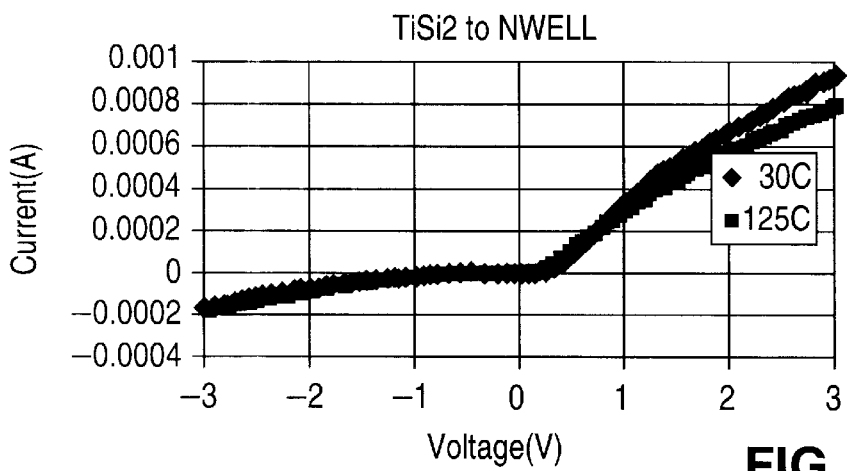
FIGS. 6A–6D are graphs illustrating the I/V relationships of diodes 290 and 292 when titanium silicide ($TiSi_2$) is formed over regions 212, 214, 216, 222, 224, and 226 in accordance with the present invention.
Figure 6B:
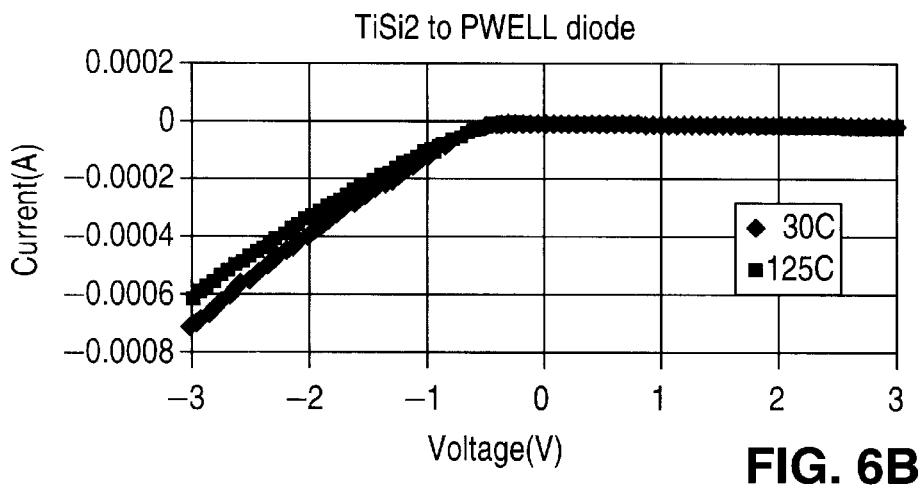
Figure 6C:
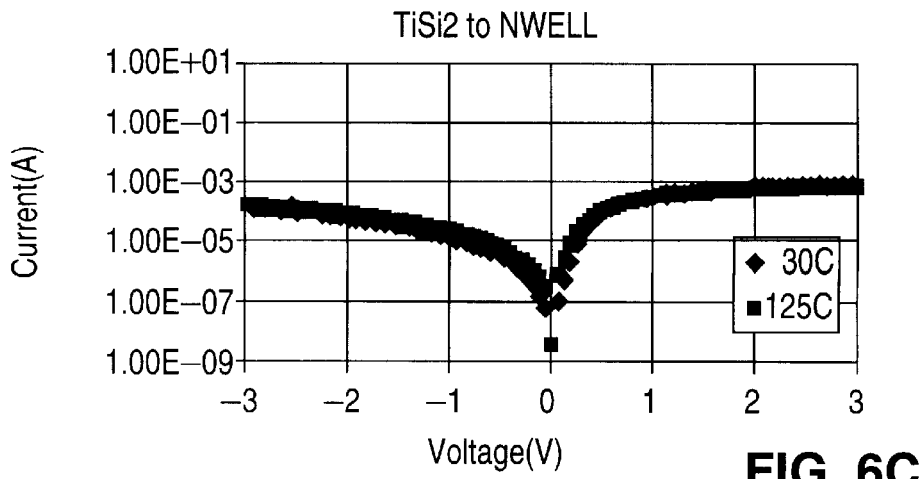
Figure 6D:
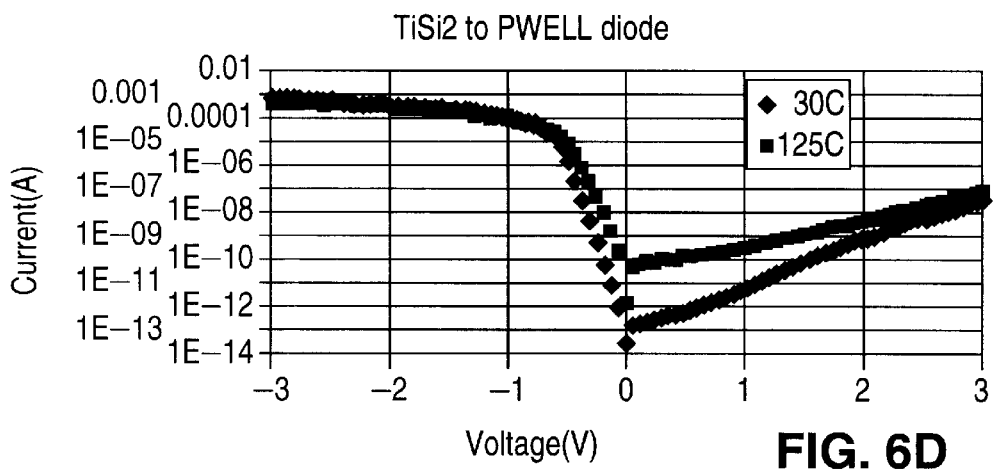
Figure 7A:
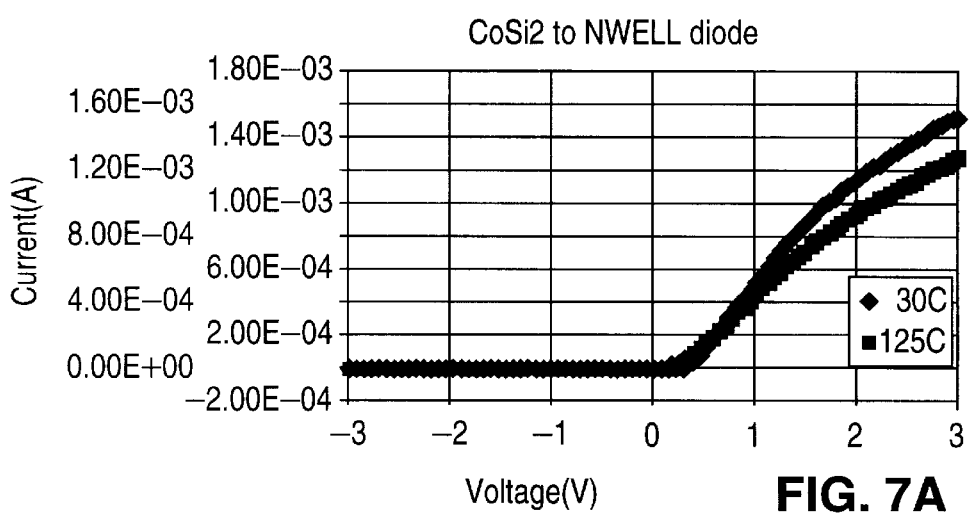
FIGS. 7A–7D are graphs illustrating the I/V relationships of diodes 290 and 292 when cobalt silicide ($CoSi_2$) is formed over regions 212, 214, 216, 222, 224, and 226 in accordance with the present invention.
Figure 7B:
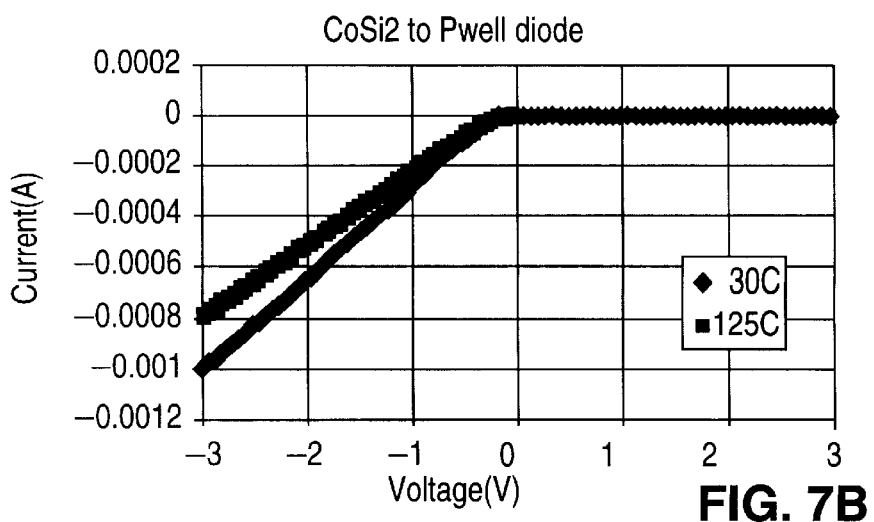
Figure 7C:
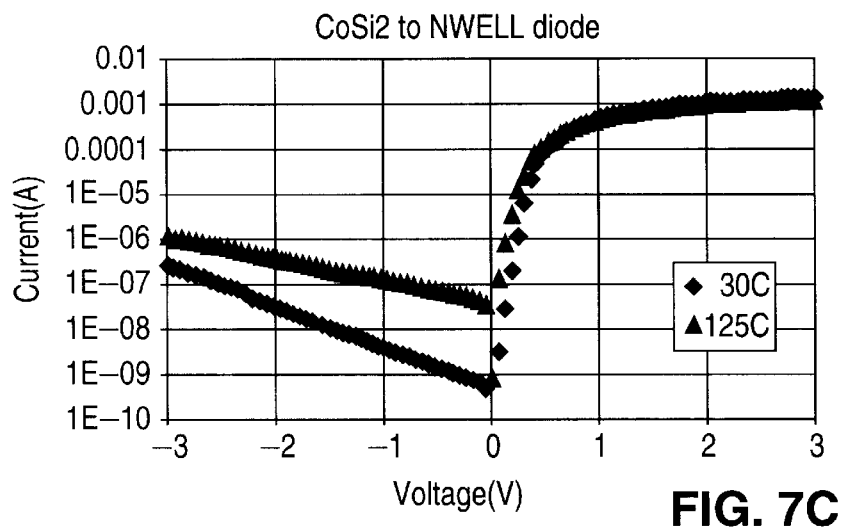
Figure 7D:
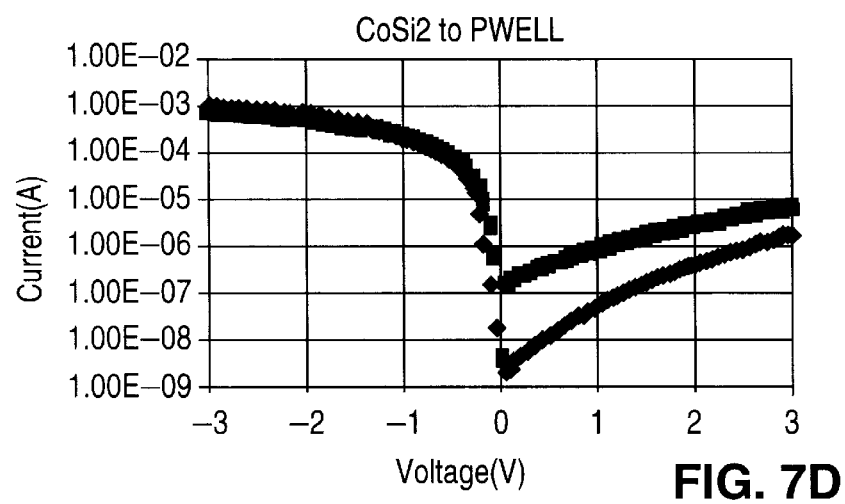
Figure 8A:
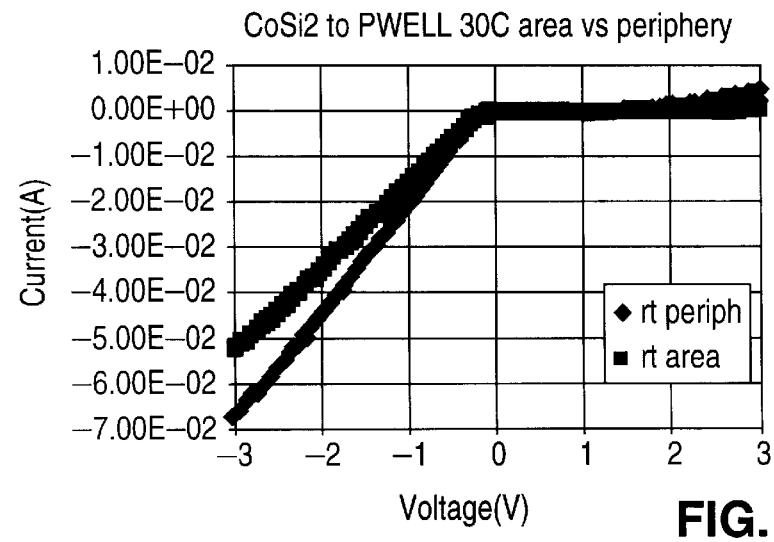
FIGS. 8A–8D are graphs illustrating the I/V relationships of diodes 290 and 292 when cobalt silicide ($CoSi_2$) is formed over regions 212, 214, 216, 222, 224, and 226 in accordance with the present invention.
Figure 8B:
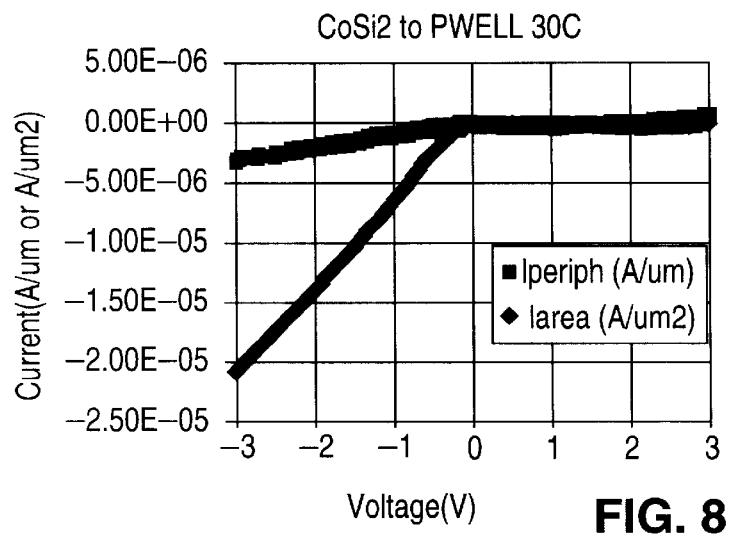
Figure 8C:
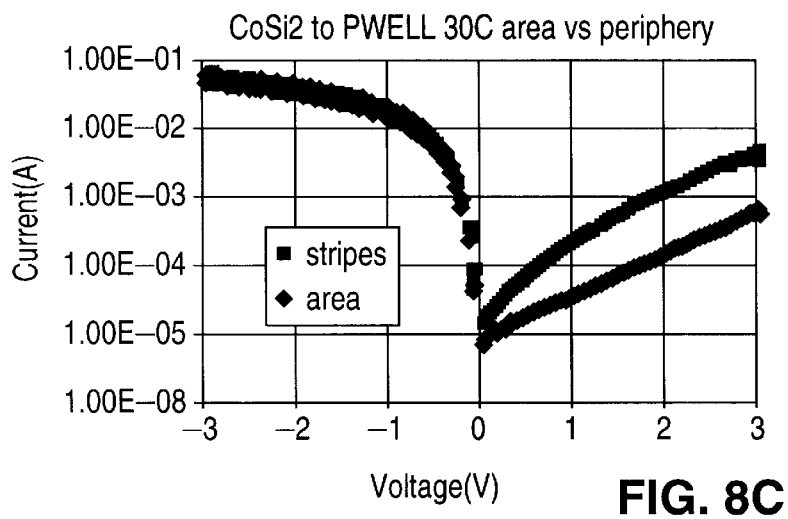
Figure 8D:
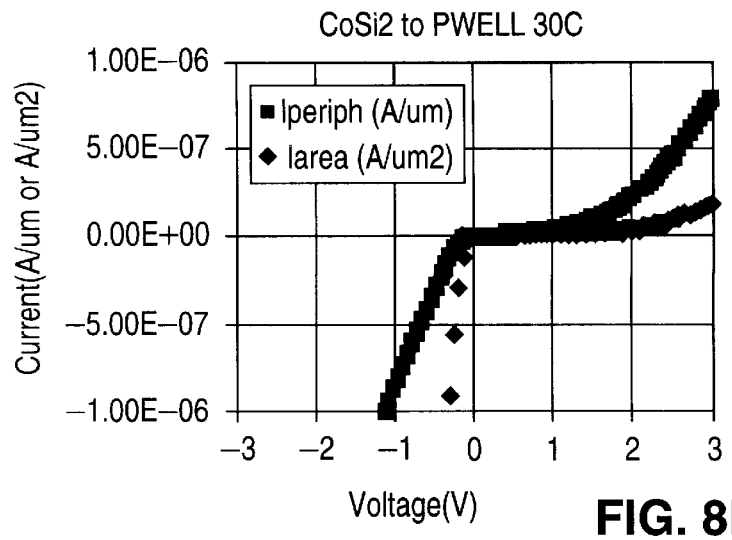
Figure 9B:
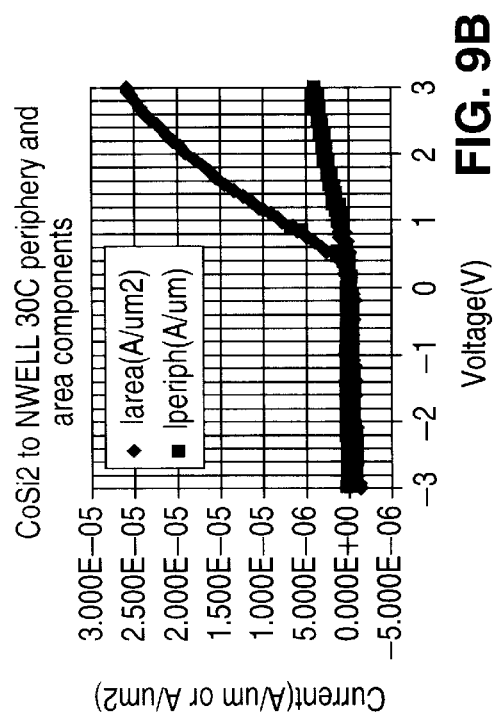
FIGS. 9A–9D are graphs illustrating the I/V relationships of diodes 290 and 292 when cobalt silicide ($CoSi_2$) is formed over regions 212, 214, 216, 222, 224, and 226 in accordance with the present invention.
Figure 9D:
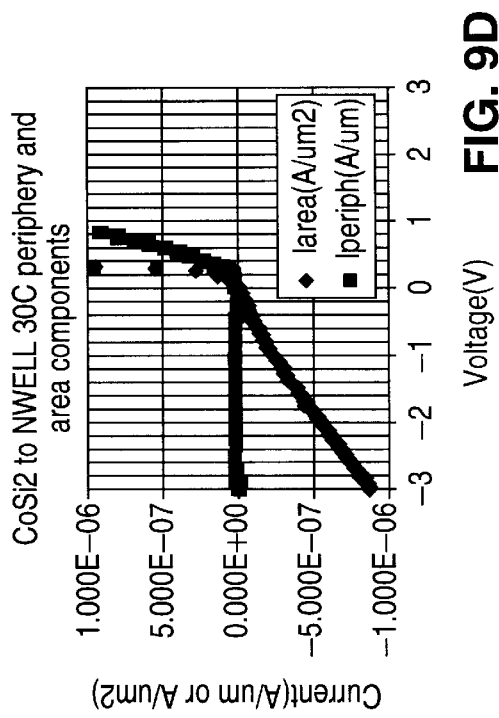
Figure 9A:
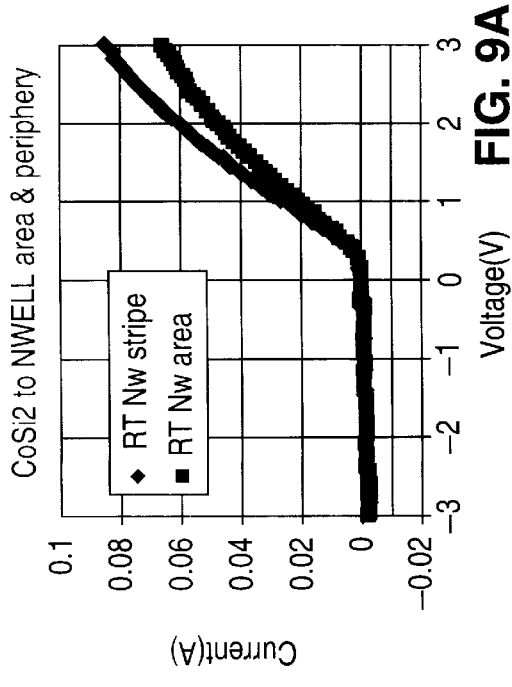
Figure 9C:
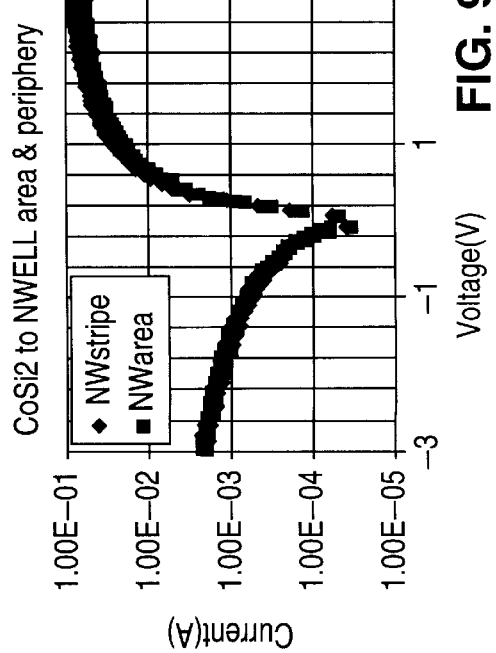

Alternately, as shown in FIGS. 5A and 5B, a two-step etch process may be used to equalize the amount of layer 408 that must be etched through to form the openings. As shown in FIG. 5A, a first mask 510 is formed so that the first etch forms openings 516 and 526 over regions 216 and 226 which have depths D1 and D2 that are approximately equal to the step heights H1 and H2 of the isolation regions FOXA and FOXB.

As a result, the remaining amount of oxide layer 408 and isolation region FOXA that must be etched away to expose region 216, and the remaining amount of oxide layer 408 and isolation region FOXB that must be etched away to expose region 226, are approximately the same as the amount of oxide layer 408 that must be removed to expose regions 212, 214, 222, and 224.

Thus, as shown in FIG. 5B, when mask 410 is formed, the second etch forms openings which expose regions 212, 214, 222, and 224, while at the same time completing the openings formed over regions 216 and 226.

Figure 4D:
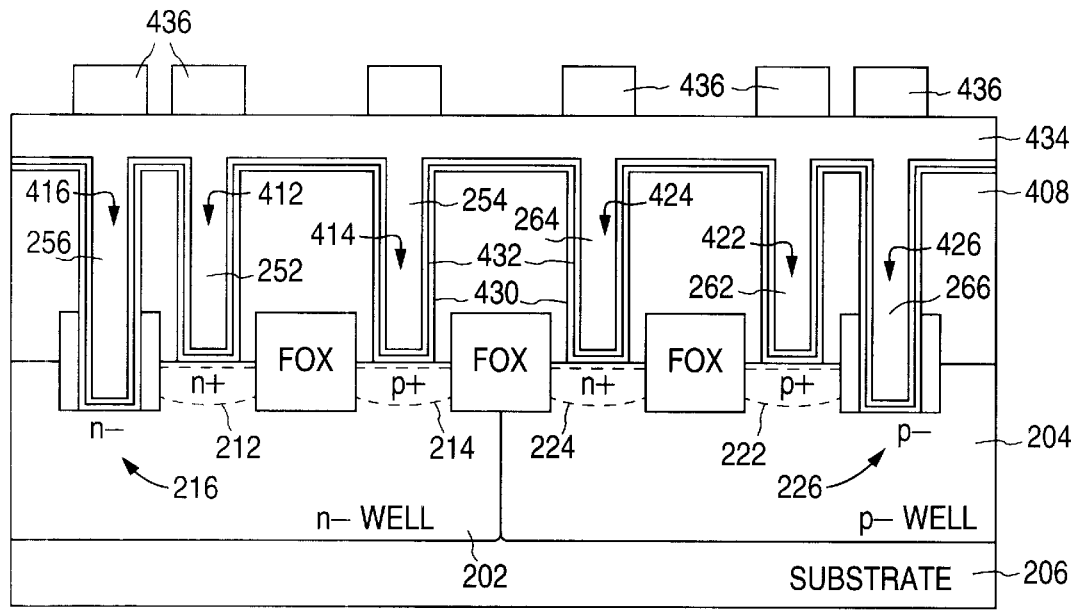

As shown in FIG. 4D, once openings 412, 414, 416, 422, 424, and 426 have been formed, mask 410 is removed. Following the removal of mask 410, the surfaces of regions 212, 214, 216, 222, 224, and 226 are cleaned to remove any native oxide that may have been formed.

After this, a layer of titanium (Ti) 430, which adheres well to silicon dioxide, is formed on the exposed surfaces of silicon dioxide layer 408, and regions 212, 214, 216, 222, 224, and 226. Next, a layer of titanium nitride (TiN) 432, which forms an excellent diffusion barrier against junction spiking, is formed over titanium layer 430. Alternately, other materials may be used to form a diffusion barrier in lieu of the combination of titanium and titanium nitride.

Junction spiking is not a serious problem for Schottky diodes, but primarily is a problem for metal contacts where the conductivity of the substrate contact region is different from the conductivity of the underlying well, e.g., a p+ region in an n-well or substrate, and an n+ region in a p-well or substrate.

Junction spiking occurs when aluminum from the to-be-formed metal-1 layer directly contacts the silicon surface of wells 202 and 204. When this aluminum-to-silicon interface is subsequently annealed, silicon easily diffuses into the aluminum which, in turn, allows aluminum to diffuse into the silicon.

If too much aluminum diffuses into the silicon, the aluminum can extend through the bottom side of the pn junction, thereby shorting out the junction. Thus, junction spiking is a significant concern with current-generation CMOS devices which utilize very shallow junction depths.

Returning to the process flow, after the layer of titanium nitride 432 has been formed, a layer of metal-1 434, such as aluminum (Al) or tungsten (W), is deposited on the surface of silicon dioxide layer 408 to fill up openings 412, 414, 416, 422, 424, and 426. The aluminum or tungsten in openings 412, 414, 416, 422, 424, and 426 forms aluminum or tungsten plugs 252, 254, 256, 262, 264, and 266.

Next, wafer 400 is annealed. When salicide layers 212a, 214a, 222a, and 224a are not used, the annealing step forms a layer of titanium silicide where the titanium contacts the silicon. When salicide layers 212a, 214a, 222a, and 224a are present, the salicide, titanium, and titanium nitride layers form metal-to-metal interfaces.

Next, a mask 436 is formed and patterned on metal-1 layer 434. Metal-1 layer 434 is then etched to define conductive paths which, in part, define the underlying circuit. Following the etch, mask 436 is removed to form the structure shown in FIG. 4E.

Figure 4E:
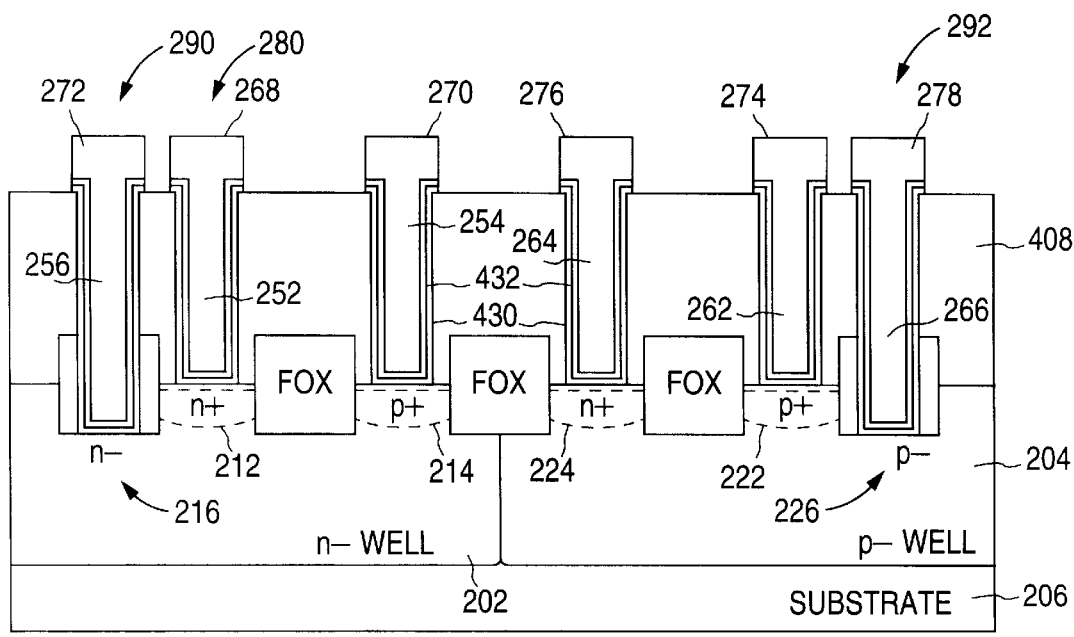

Thus, as shown in FIG. 4E, substrate biasing contact 270 is formed by n+ region 212, barrier layers 430 and 432, and plug 242, while substrate biasing contact 272 is formed by p+ region 222, barrier layers 430 and 432, and plug 252. In addition, source/drain contact 274 is formed by p+ region 214, barrier layers 430 and 432, and plug 244, while source/drain contact 276 is formed by n+ region 224, barrier layers 430 and 432, and plug 254.

Further, Schottky diode 290 is formed by n– region 216, barrier layers 430 and 432, and plug 246, while Schottky diode 292 is formed by p– region 226, barrier layers 430 and 432, and plug 256.

FIGS. 6A–6D show a series of graphs that illustrate the I/V relationships of diodes 290 and 292 when titanium silicide ($TiSi_2$) is formed over regions 212, 214, 216, 222, 224, and 226. FIGS. 7A–7D, 8A–8D, and 9A–9D each show a series of graphs that illustrate the I/V relationships of diodes 290 and 292 when cobalt silicide ($CoSi_2$) is formed over regions 212, 214, 216, 222, 224, and 226.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A semiconductor wafer comprising:
    a semiconductor material having a first conductivity type and a first dopant concentration;
    a first region formed in the semiconductor material, the first region having a second conductivity type and a second dopant concentration;
    a field oxide region formed in the semiconductor material, the field oxide region having a first opening that extends therethrough, the first opening having sidewalls;
    a second region defined in the semiconductor material to adjoin the first opening in the field oxide region, the second region having the first conductivity type and the first dopant concentration;
    a layer of insulation material formed over the first region and the field oxide region, the layer of insulation material having a second opening that extends therethrough, and a third opening that extends therethrough, the second opening adjoining the first region, the third opening adjoining the first opening, the second and third openings having sidewalls;
    a layer of barrier material formed on the sidewalls of the second opening, the first region, the sidewalls of the first and third openings, and the second region;
    a first metal plug formed in the second opening to contact the layer of barrier material; and
    a second metal plug formed in the first and third openings to contact the layer of barrier material.

2. The wafer of claim 1 and further comprising a third region formed in the semiconductor material, the third region having the first conductivity type and a third dopant concentration, the third dopant concentration being greater than the first dopant concentration.

3. The wafer of claim 1 wherein the barrier material includes titanium silicide.

4. The wafer of claim 1 wherein the barrier material includes titanium and titanium nitride.

5. The wafer of claim 1 wherein the first region includes an overlying layer of salicide.

6. The wafer of claim 1 wherein the third region includes an overlying layer of salicide.

7. A semiconductor wafer comprising:
    a semiconductor material having a first conductivity type and a first dopant concentration;
    a first region formed in the semiconductor material, the first region having the first conductivity type and a second dopant concentration, the second dopant concentration being greater than the first dopant concentration;
    a field oxide region formed in the semiconductor material, the field oxide region having a first opening that extends therethrough, the first opening having sidewalls;
    a second region defined in the semiconductor material to adjoin the first opening in the field oxide region, the second region having the first conductivity type and the first dopant concentration;
    a layer of insulation material formed over the first region and the field oxide region, the layer of insulation material having a second opening that extends therethrough, and a third opening that extends therethrough, the second opening adjoining the first region, the third opening adjoining the first opening, the second and third openings having sidewalls;
    a layer of barrier material formed on the sidewalls of the second opening, the first region, the sidewalls of the first and third openings, and the second region;
    a first metal plug formed in the second opening to contact the layer of barrier material; and
    a second metal plug formed in the first and third openings to contact the layer of barrier material.

8. The wafer of claim 7 wherein the first region includes an overlying layer of salicide.

9. A semiconductor wafer comprising:
    a semiconductor material;
    a first well having a first conductivity type and a first dopant concentration formed in the semiconductor material;
    a first region formed in the first well, the first region having the first conductivity type and a second dopant concentration which is greater than the first dopant concentration;
    a first field oxide region formed in the first well, the first field oxide region having a first opening that extends therethrough, the first opening having sidewalls;
    a second region defined in the first well to adjoin the first opening in the first field oxide region, the second region having the first conductivity type and the first dopant concentration;
    a layer of insulation material formed over the first region and the first field oxide region, the layer of insulation material having a second opening that extends therethrough, and a third opening that extends therethrough, the second opening adjoining the first region, the third opening adjoining the first opening, the second and third openings having sidewalls;
    a layer of barrier material formed on the sidewalls of the second opening, the first region, the sidewalls of the first and third openings, and the second region;

a first metal plug formed in the second opening to contact the layer of barrier material; and a second metal plug formed in the first and third openings to contact the layer of barrier material.

10. The wafer of claim 9 and further comprising:

a second well having a second conductivity type and a third dopant concentration formed in the semiconductor material;

a third region formed in the second well, the first region having the second conductivity type and a fourth dopant concentration which is greater than the third dopant concentration;

a second field oxide region formed in the second well, the second field oxide region having a first opening that extends therethrough, the first opening of the second field oxide region having sidewalls;

a fourth region defined in the second well to adjoin the first opening in the second field oxide region, the fourth region having the second conductivity type and the third dopant concentration;

wherein the layer of insulation material is formed over the third region and the second field oxide region, the layer of insulation material having a fourth opening that extends therethrough, and a fifth opening that extends therethrough, the fourth opening adjoining the third region, the fifth opening adjoining the first opening in the second field oxide region, the fourth and fifth openings having sidewalls;

wherein the layer of barrier material is formed on the sidewalls of the fourth opening, the third region, the sidewall of the first opening in the field oxide region, and the sidewall of the fifth opening, and the fourth region;

a third metal plug formed in the fourth opening to contact the layer of barrier material; and a fourth metal plug formed in the first opening of the second field oxide region, and the fifth opening to contact the layer of barrier material.

11. The wafer of claim 10 wherein the barrier material includes titanium silicide.

12. The wafer of claim 10 wherein the barrier material includes titanium and titanium nitride.

13. The wafer of claim 10 wherein the first region includes an overlying layer of salicide.

\* \* \* \* \*